United States Patent
Maruoka

(10) Patent No.: US 6,844,254 B2
(45) Date of Patent: Jan. 18, 2005

(54) SEMICONDUCTOR DEVICE HAVING BONDING PAD ELECTRODE OF MULTI-LAYER STRUCTURE

(75) Inventor: Michiaki Maruoka, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 199 days.

(21) Appl. No.: 10/024,103

(22) Filed: Dec. 17, 2001

(65) Prior Publication Data

US 2002/0094670 A1 Jul. 18, 2002

(30) Foreign Application Priority Data

Dec. 26, 2000 (JP) ........................................ 2000-394040

(51) Int. Cl.[7] .............................................. H01L 21/44
(52) U.S. Cl. ...................................... 438/612; 438/615
(58) Field of Search ................................. 438/612, 615; 257/762, 763, 766, 772, 779, 784

(56) References Cited

U.S. PATENT DOCUMENTS

| | | | | | |
|---|---|---|---|---|---|
| 4,775,643 | A | * | 10/1988 | Wetteroth | .................. 438/533 |
| 6,376,910 | B1 | * | 4/2002 | Munoz et al. | .............. 257/741 |
| 6,396,127 | B1 | * | 5/2002 | Munoz et al. | .............. 257/666 |
| 6,597,032 | B1 | * | 7/2003 | Lee | ............................. 257/303 |
| 2002/0013011 | A1 | * | 1/2002 | Yamanaka et al. | ............ 438/30 |
| 2002/0192921 | A1 | * | 12/2002 | Hsue et al. | ................. 438/386 |

FOREIGN PATENT DOCUMENTS

JP    2000-114445    4/2000

* cited by examiner

*Primary Examiner*—W. David Coleman
*Assistant Examiner*—Khiem Nguyen
(74) *Attorney, Agent, or Firm*—Katten Muchin Zavis Rosenman

(57) ABSTRACT

A semiconductor device having bonding pad electrode or electrodes of a multi-layer structure. The bonding pad electrode comprises a lower electrode layer formed on a semiconductor substrate, and a cover insulating film formed on the lower electrode layer. The cover insulating film has an opening for exposing at least a portion of the lower electrode layer. A step portion is provided at a side wall of the opening of the cover insulating film. The size of the opening at the upside portion of a step surface of the step portion is larger than the size of the opening at the downside portion of the step surface. The bonding pad electrode further comprises an upper electrode layer formed on the portion of the lower electrode layer exposed via the opening. The upper electrode layer is made of material having corrosion resistance against the substance which is corrosive to the lower electrode layer, and the upper electrode layer overlaps the step surface of the step portion.

10 Claims, 11 Drawing Sheets

PRIOR ART

PRIOR ART

SEMICONDUCTOR DEVICE HAVING BONDING PAD ELECTRODE OF MULTI-LAYER STRUCTURE

FIELD OF THE INVENTION

The present invention relates generally to a semiconductor device and a method of manufacturing the semiconductor device. More particularly, the present invention relates to a semiconductor device having bonding pad electrode or electrodes of a multi-layer structure which have high corrosion resistance, and a method of manufacturing such semiconductor device.

BACKGROUND OF THE INVENTION

With reference to a partial enlarged cross sectional view of FIG. 12, an explanation will be made on a bonding pad electrode structure conventionally used. In FIG. 12, a reference numeral 101 designates an aluminum film electrically coupled with a predetermined region of a semiconductor substrate which is not shown in the drawing and in which a circuit element is formed. For example, if the circuit element is a MOSFET, the aluminum film 101 is a source electrode coupled with a source region of the MOSFET. On the aluminum film 101, there is formed a cover insulating film 102 made, for example, of PSG (phospho silicate glass). The cover insulating film 102 has an opening 102a. On a portion of the aluminum film 101 which is exposed via the opening 102a of the cover insulating film 102, there is formed a TiNiAg film 103. Ideally, the TiNiAg film 103 is formed such that it partially overlaps the cover insulating film 102. Thereby, it becomes possible to obtain a bonding pad electrode structure in which the aluminum film 101 can be protected from a corrosive substance which can corrode aluminum.

The above-mentioned conventional bonding pad electrode structure is fabricated as follows. That is, after forming the opening 102a in the cover insulating film 102, the TiNiAg film 103 is deposited on whole area of the semiconductor substrate. The TiNiAg film 103 comprises, for example, a Ti film having a thickness of 1000 angstroms, an Ni film having a thickness of 1000 angstroms and an Ag film having a thickness of 10000 angstroms. A photo resist film having predetermined patterns, i.e., a patterned photo resist film, not shown in the drawing, is formed on the TiNiAg film 103 such that the patterned photo resist film overlaps with the cover insulating film 102. In this case, a photolithography method is used. The patterned photo resist film masks an area wider than the area of the opening 102a of the cover insulating film 102. By using the patterned photo resist film as an etching mask, the TiNiAg film 103 is etched. The patterned photo resist film is then removed. Thereby, the bonding pad electrode structure shown in FIG. 12 can be formed. However, the process of etching the TiNiAg film 103 having the above-mentioned thickness is technically very difficult process and workability or productivity by the above-mentioned method is very low. Therefore, manufacturing costs of the semiconductor device become high.

In order to solve such problems of the above-mentioned method, an improved method is conventionally used. With reference to partial enlarged cross sectional views of FIG. 13A, FIG. 13B and FIGS. 14A–14C, an explanation will be made on such conventional improved method. In the first process, a cover insulating film 102 is formed on an aluminum film 101 by using an atmospheric pressure CVD method. The cover insulating film 102 is made of a PSG film having a thickness of, for example, 10000 angstroms. FIG. 13A is a cross sectional view showing a condition after finishing the first process.

After finishing the first process, in the second process, a patterned photo resist film 104 is formed on the cover insulating film 102 by using a photolithography method. The patterned photo resist film 104 has an opening 104a at a location corresponding to a bonding pad electrode. FIG. 13B is a cross sectional view showing a condition after finishing the second process.

After finishing the second process, in the third process, by using the patterned photo resist film 104 as an etching mask, a portion of the cover insulating film 102 at a location corresponding to the bonding pad electrode is removed. In this case, an isotropic etching method, such as an wet etching method, is used. Thereby, the opening 102a is formed in the cover insulating film 102. FIG. 14A is a cross sectional view showing a condition after finishing the third process.

After finishing the third process, in the fourth process, while leaving the patterned photo resist film 104, a TiNiAg film 103 is formed on the patterned photo resist film 104 by using a sputtering method. FIG. 14B is a cross sectional view showing a condition after finishing the fourth process.

After finishing the fourth process, in the fifth process, portions of the TiNiAg film 103 on the patterned photo resist film 104 are removed by using a lift-off method, and further the patterned photo resist film 104 is removed. FIG. 14C is a cross sectional view showing a condition after finishing the fifth process.

When the bonding pad electrode is fabricated by using the above-mentioned method illustrated in FIG. 13A, FIG. 13B and FIGS. 14A–14C, the following problems arise. That is, as shown in FIG. 14A, the cover insulating film 102 is side-etched and the opening 102a of the cover insulating film 102 becomes wider than the opening 104a of the patterned photo resist film 104. Therefore, as shown in FIG. 14B, on the aluminum film 101, a gap is produced between the TiNiAg film 103 and the cover insulating film 102. Thus, as shown in FIG. 14C, a portion of the aluminum film 101 is exposed via the gap between the TiNiAg film 103 and the cover insulating film 102. In such bonding pad electrode structure, it is impossible completely protect the aluminum film 101 from the corrosive substance.

In order to prevent the opening 102a of the cover insulating film 102 from becoming wider than the opening 104a of the patterned photo resist film 104 due to the side-etch of the cover insulating film 102, the following method can be considered. That is, by using the patterned photo resist film 104 as an etching mask, a portion of the cover insulating film 102 corresponding to a pad location can be removed by ion etching, such as plasma etching. However, in this case, another problem arises as follows. That is, there is a possibility that a portion of the TiNiAg film 103 on the patterned photo resist film 104 connects with a portion of the TiNiAg film 103 on the aluminum film 101. Thereby, it becomes difficult to remove portions of the TiNiAg film 103 on the patterned photo resist film 104 by using a lift-off method.

SUMMARY OF THE INVENTION

Therefore, it is an object of the present invention to provide a semiconductor device having a bonding pad electrode which can be formed by using a lift-off method and in which a lower electrode layer is not exposed between a cover insulating film and an upper electrode layer, and to provide a method of manufacturing such semiconductor device.

It is another object of the present invention to provide a semiconductor device which has a bonding pad electrode and which can be manufactured at low cost, and to provide a method of manufacturing such semiconductor device.

It is still another object of the present invention to obviate the disadvantages of the conventional semiconductor device having bonding pad electrodes and of the conventional method of manufacturing such semiconductor device.

According to an aspect of the present invention, there is provided a semiconductor device having a bonding pad electrode of a multi-layer structure, the semiconductor device comprising: a semiconductor substrate; a lower electrode layer formed on the semiconductor substrate; a cover insulating film formed on the lower electrode layer, wherein the cover insulating film has an opening for exposing at least a portion of the lower electrode layer, a step portion is provided at a side wall of the opening of the cover insulating film, the size of the opening at the upside portion of a step surface of the step portion is larger than the size of the opening at the downside portion of the step surface; and an upper electrode layer formed on the portion of the lower electrode layer exposed via the opening, the upper electrode layer being made of material having corrosion resistance against substance which is corrosive to the lower electrode layer, and the upper electrode layer overlaps the step surface of the step portion.

In this case, it is preferable that the cover insulating film comprises a silicon nitride film and a PSG (phospho silicate glass) film formed on the silicon nitride film, the step surface of the step portion being a surface portion of the silicon nitride film.

It is also preferable that the cover insulating film comprises a PSG film.

It is further preferable that the lower electrode layer comprises a metal film containing aluminum, and the upper electrode layer comprises a metal film which has corrosion resistance against substance corrosive to aluminum.

It is advantageous that the upper electrode layer comprises a TiNiAg film.

It is also advantageous that the semiconductor device further comprises a high conductivity metal plate coupled onto the upper electrode layer via a conductive paste.

It is further advantageous that the conductive paste is an Ag paste, and the metal plate is a copper plate.

It is preferable that the bonding pad electrode is a source pad electrode of a power MOSFET.

It is also preferable that the bonding pad electrode is a source pad electrode of a MOSFET.

According to another aspect of the present invention, there is provided a method of manufacturing a semiconductor device having a bonding pad electrode of a multi-layer structure, the method comprising: preparing a semiconductor substrate; forming a lower electrode layer on the semiconductor substrate; forming a cover insulating film on the lower electrode layer; forming an opening in the cover insulating film to expose at least a portion of the lower electrode layer, wherein a step portion is provided at a side wall of the opening of the cover insulating film, the size of the opening at the upside portion of a step surface of the step portion is larger than the size of the opening at the downside portion of the step surface; and forming an upper electrode layer on the portion of the lower electrode layer exposed via the opening, wherein the upper electrode layer being made of material having corrosion resistance against substance which is corrosive to the lower electrode layer, and the upper electrode layer overlaps the step surface of the step portion.

In this case, it is preferable that the forming an opening in the cover insulating film to expose at least a portion of the lower electrode layer comprises: forming a photo resist film having a first opening on the cover insulating film; and isotropically etching the cover insulating film by using the photo resist film as an etching mask, wherein the cover insulating film is side-etched with respect to the first opening of the photo resist film; wherein the forming an upper electrode layer on the portion of the lower electrode layer exposed via the opening is performed by using a lift-off method in which the photo resist film is used as a mask.

It is also preferable that the cover insulating film comprises a silicon nitride film and a PSG film; wherein the forming the cover insulating film on the lower electrode layer comprises: forming the silicon nitride film on the lower electrode layer; and forming the PSG film on the silicon nitride film; wherein the forming an opening in the cover insulating film to expose at least a portion of the lower electrode layer comprises: forming a photo resist film having a first opening on the PSG film; isotropically etching the PSG film by using the photo resist film as an etching mask to form a second opening in the PSG film, wherein at least a portion of the silicon nitride film is exposed at the bottom portion of the second opening, and the PSG film is side-etched with respect to the first opening of the photo resist film; and plasma etching the silicon nitride film by using the photo resist film as an etching mask to form a third opening in the silicon nitride film, wherein at least a portion of the lower electrode layer is exposed at the bottom portion of the third opening, the third opening is smaller than the second opening, and the step surface of the step portion is formed by the upper surface portion of the silicon nitride film exposed via the second opening of the PSG film; and wherein the forming an upper electrode layer on the portion of the lower electrode layer exposed via the opening of the cover insulating film comprises: depositing a material to be the upper electrode layer on the exposed portion of the lower electrode layer, at least a portion of the step surface and the photo resist film; and removing a portion of the material deposited on the photo resist film by using a lift-off method, wherein portions of the material deposited on the exposed portion of the lower electrode layer and on the step portion are not removed, thereby the upper electrode layer is formed.

It is further preferable that the cover insulating film comprises a silicon nitride film and a PSG film; wherein the forming the cover insulating film on the lower electrode layer comprises: forming the silicon nitride film on the lower electrode layer; forming a first photo resist film having a first opening on the silicon nitride film; plasma etching the silicon nitride film by using the first photo resist film as an etching mask to form a second opening in the silicon nitride film; removing the first photo resist film; and forming the PSG film on the silicon nitride film so as to fill the second opening of the silicon nitride film; wherein the forming an opening in the cover insulating film to expose at least a portion of the lower electrode layer comprises: forming a second photo resist film having a third opening on the PSG film, wherein the third opening is larger than the second opening; and isotropically etching the PSG film by using the second photo resist film as an etching mask to form a fourth opening in the PSG film, wherein the PSG film is side-etched with respect to the third opening of the second photo resist film, the fourth opening is larger than the second opening, at least a portion of the lower electrode layer is exposed via the second and fourth openings, and the upper surface portion of the silicon nitride film exposed via the fourth opening of the PSG film forms the step surface of the step portion; wherein the forming an upper electrode layer on the portion of the lower electrode layer exposed via the opening of the cover insulating film comprises: depositing a material to be the upper electrode layer on the exposed portion of the lower electrode layer, at least a portion of the step surface and the photo resist film; and removing a portion of the material deposited on the second photo resist film by using a lift-off method, wherein portions of the material deposited on the exposed portion of the lower electrode layer and on the step surface are not removed, thereby the upper electrode layer is formed.

It is advantageous that, in the forming the cover insulating film on the lower electrode layer, a PSG (phospho silicate glass) film is formed as the cover insulating film on the lower electrode layer; wherein the forming an opening in the cover insulating film to expose at least a portion of the lower electrode layer comprises: forming a first photo resist film having a first opening on the PSG film; etching the PSG film by using the first photo resist film as an etching mask to form a trench in the PSG film, wherein, in the bottom portion of the trench, the lower electrode layer is not exposed; removing the first photo resist film; forming a second photo resist film having a second opening on the PSG film, wherein the second opening is larger than the size of the trench; and isotropically etching the PSG film by using the second photo resist film as an etching mask to expose at least a portion of the lower electrode layer at the bottom portion of the trench, wherein the PSG film is side-etched with respect to the second opening of the second photo resist film, and the step surface of the step portion is formed at the side surface of the exposed PSG film; wherein the forming an upper electrode layer on the portion of the lower electrode layer exposed via the opening of the cover insulating film comprises: depositing a material to be the upper electrode layer on the exposed portion of the lower electrode layer, at least a portion of the step surface and the second photo resist film; and removing a portion of the material deposited on the second photo resist film by using a lift-off method, wherein portions of the material deposited on the exposed portion of the lower electrode layer and on the step surface are not removed, thereby the upper electrode layer is formed.

It is also advantageous that the lower electrode layer comprises a metal film containing aluminum, and the upper electrode layer comprises a metal film which has corrosion resistance against substance corrosive to aluminum.

It is further advantageous that the upper electrode layer comprises a TiNiAg film.

It is preferable that the method of manufacturing a semiconductor device further comprises: coupling a high conductivity metal plate onto the upper electrode layer via a conductive paste, after forming the upper electrode layer on a portion of the lower electrode layer exposed via the opening.

It is also preferable that the conductive paste is an Ag paste, and the metal plate is a copper plate.

It is further preferable that the bonding pad electrode is a source pad electrode of a power MOSFET.

It is advantageous that the bonding pad electrode is a source pad electrode of a MOSFET.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
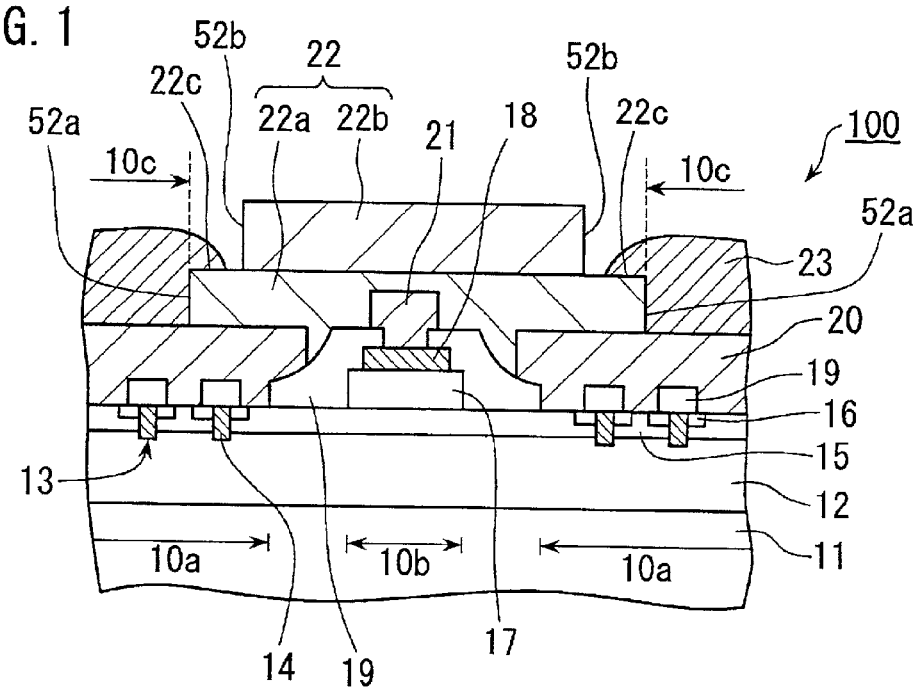
FIG. 1 is a partial enlarged cross sectional view schematically showing a MOSFET 100 having an UMOS structure according to a first device embodiment of the present invention.

With reference to the drawings, embodiments of the present invention will now be described in detail. FIG. 1 is a partial enlarged cross sectional view schematically showing a MOSFET 100 having an UMOS structure, according to a first device embodiment of the present invention. The MOSFET 100 according to the first device embodiment of the present invention comprises an N+ type, i.e., a first conductivity type, silicon substrate 11 having a high impurity concentration. On the silicon substrate 11, an N− type epitaxial layer 12 is formed. U-shaped trench or trenches 13 are formed in cell portions 10a at the surface of the epitaxial layer 12. Inside the U-shaped trench 13, a gate electrode 14 is formed via a gate oxide film not shown in the drawing. The gate electrode 14 is made of polysilicon. At a surface layer portion of the epitaxial layer 12 separated by the U-shaped trenches 13 of the cell portion 10a, there is formed a P type, i.e., a second conductivity type, base region 15. At a surface layer of the base region 15 and in contact with the U-shaped trenches 13, there is formed an N+ type source region 16. In a gate finger portion 10b interposed between the cell portions 10a on the epitaxial layer 12, a polysilicon gate finger 18 is formed via a field oxide film 17. The polysilicon gate finger 18 is formed simultaneously with the gate electrode 14. On the epitaxial layer 12 on which the structure mentioned above is formed, an interlayer insulating film 19 is formed. The interlayer insulating film 19 comprises a BPSG film. On the interlayer insulating film 19, a source electrode 20 is formed. The source electrode 20 is electrically contacted with the base region 15 and the source region 16 in the cell portion 10a via openings of the interlayer insulating film 19. The source electrode 20 comprises an aluminum film as a lower electrode layer of the bonding pad electrode. In the gate finger portion 10b, there is formed an aluminum gate finger 21. The aluminum gate finger 21 is electrically contacted with the polysilicon gate finger 18. The aluminum gate finger 21 is formed simultaneously with the source electrode 20. On such structure, a silicon nitride film 22a and a PSG film 22b are formed in order as a cover insulating film 22. Via opening 52a and opening 52b of the silicon nitride film 22a and the PSG film 22b, there is formed a TiNiAg film 23 in a source pad portion 10c on the source electrode 20. The TiNiAg film 23 functions as an upper layer electrode of the bonding pad electrode. The TiNiAg film 23 is a film having a multi-layer structure comprising a Ti film, an Ni film and an Ag film. The opening 52b of the PSG film 22b is wider than the opening 52a of the silicon nitride film 22a. Therefore, there is produced a step portion at each edge or each side wall of the opening of the cover insulating film 22. That is, a step surface 22c is formed by an upper surface portion of the silicon nitride film 22a which is exposed via the opening 52b of the PSG film 22b. The TiNiAg film 23 is formed such that a portion of the TiNiAg film 23 overlaps the step surface 22c.

Figure 2:
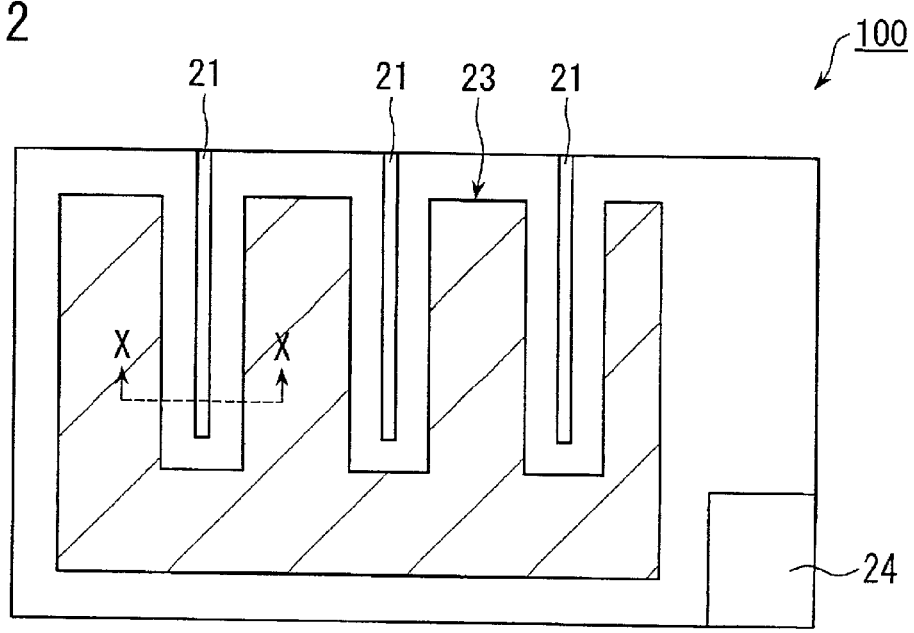
FIG. 2 is a schematic plan view of the MOSFET 100 of FIG. 1.

FIG. 2 is a schematic plan view of the MOSFET 100 of FIG. 1. The cross sectional view shown in FIG. 1 corresponds to a cross sectional view taken along the section line X—X of the chip surface of MOSFET 100 shown in FIG. 2. In the plan view of FIG. 2, there is also shown a gate pad portion 24.

In the above-mentioned structure, the cover insulating film 22 has a multi-layer structure comprising the silicon nitride film 22a and the PSG film 22b. The opening 52b of the PSG film 22b is wider than the opening 52a of the silicon nitride film 22a. Therefore, as mentioned above, there is produced a step portion at each edge of the opening of the cover insulating film 22. That is, the step surface 22c is formed by an upper surface portion of the silicon nitride film 22a which is exposed via the opening 52b of the PSG film 22b. The TiNiAg film 23 is formed such that the TiNiAg film 23 partially overlaps the step surface 22c. Therefore, in the MOSFET 100 according to the present embodiment, it is possible to completely protect the source electrode 20 made of an aluminum film of the source pad portion 10c from the corrosive substance. Here, the corrosive substance is the substance which can corrode the source electrode 20.

Next, with reference to partial enlarged cross sectional views of FIGS. 3A–3C and FIGS. 4A–4C, an explanation will be made on a method of manufacturing the MOSFET 100, according to a first method embodiment. A process until the source electrode 20 and the aluminum gate finger 21 are formed can be the same as a conventionally used process, and an explanation thereof will be omitted here. Therefore, a process of forming the cover insulating film 22 and a process thereafter will be described here. FIGS. 3A–3C and FIGS. 4A–4C only show cross sections corresponding to a portion on the source electrode 20 and in the proximity of an edge of the opening of the cover insulating film 22.

Figure 3A:
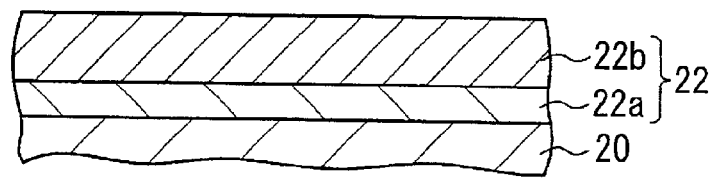
FIGS. 3A–3C are partial enlarged cross sectional views illustrating structures obtained during a process of manufacturing the MOSFET 100 of FIG. 1, according to a first method embodiment.

First, in the first process, a silicon nitride film 22a and a PSG film 22b are sequentially formed as a cover insulating film 22 on a source electrode 20. The silicon nitride film 22a is formed by using a plasma CVD method, and has a thickness of, for example, 5000 angstroms. The PSG film 22b is formed by using an atmospheric pressure CVD method, and has a thickness of, for example, 10000 angstrom. FIG. 3A is a cross sectional view showing a condition after finishing the first process.

Figure 3B:
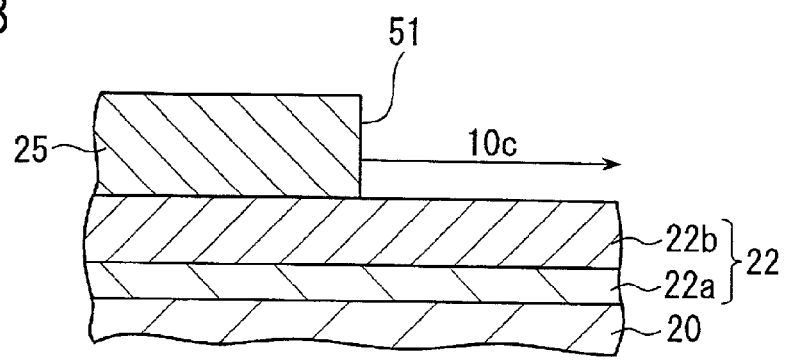

After finishing the first process, in the second process, a photo resist film having predetermined patterns, i.e., a patterned photo resist film 25 is formed on the PSG film 22b by using a photolithography method. The patterned photo resist film 25 has an opening 51 which corresponds to a source pad portion 10c. FIG. 3B is a cross sectional view showing a condition after finishing the second process.

Figure 3C:
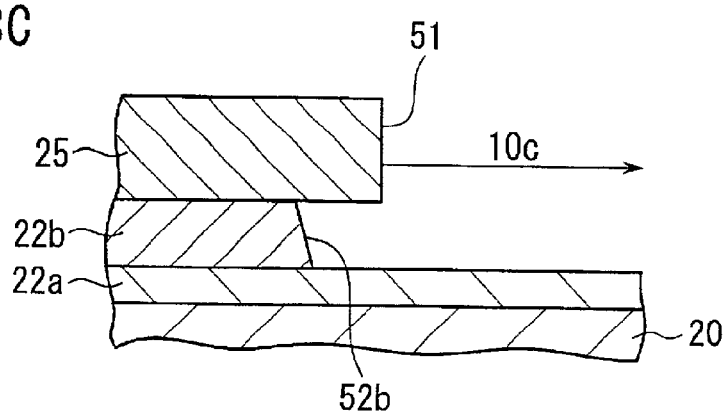

After finishing the second process, in the third process, while leaving the patterned photo resist film 25, and by using the patterned photo resist film 25 as an etching mask, a portion of the PSG film 22b corresponding to the source pad portion 10c is selectively removed by isotropic etching, for example, by an wet etching method. Thereby, an opening 52b is formed in the PSG film 22b. In this process, the PSG film 22b is also side-etched from each edge of the patterned photo resist film 25. Therefore, the opening 52b of the PSG film 22b becomes wider than the opening 51 of the patterned photo resist film 25 by the amount of the side-etching. FIG. 3C is a cross sectional view showing a condition after finishing the third process.

Figure 4A:
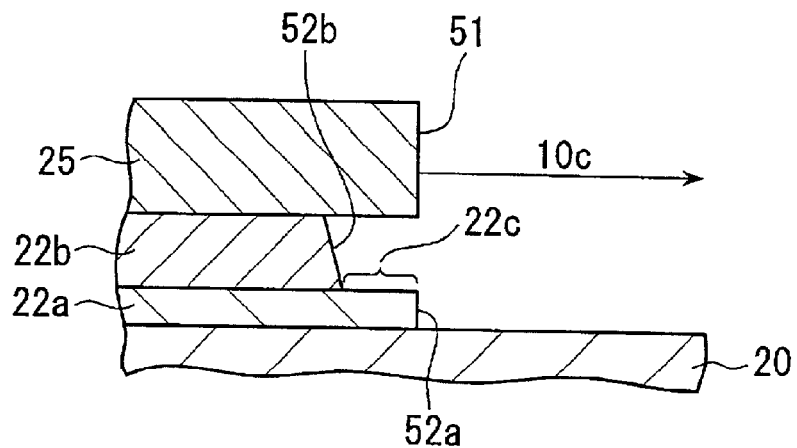
FIGS. 4A–4C are partial enlarged cross sectional views illustrating structures obtained after the structures shown in FIGS. 3A–3C during a process of manufacturing the MOSFET 100 of FIG. 1, according to the first method embodiment.

After finishing the third process, in the fourth process, by using the patterned photo resist film 25 as an etching mask, a portion of the silicon nitride film 22a corresponding to the source pad portion 10c is selectively removed by a plasma etching. Thereby, an opening 52a is formed in the silicon nitride film 22a. In this case, the width of the opening 52a of the silicon nitride film 22a becomes approximately the same as that of the opening 51 of the patterned photo resist film 25. Therefore, the opening 52b of the PSG film 22b becomes wider than the opening 52a of the silicon nitride film 22a. Thus, there is produced a step portion at each edge or side wall of the opening of the cover insulating film 22. That is, the step surface 22c is formed by an upper surface portion of the silicon nitride film 22a which is exposed via the opening 52b of the PSG film 22b. FIG. 4A is a cross sectional view showing a condition after finishing the fourth process.

Figure 4B:
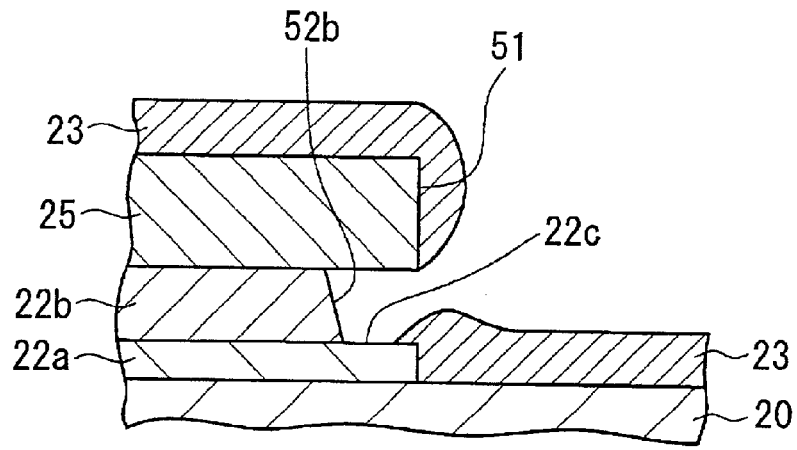

After finishing the fourth process, in the fifth process, while leaving the patterned photo resist film 25, an TiNiAg film 23 is deposited by using a sputtering method or a vapor deposition method. The TiNiAg film 23 comprises, for example, a Ti film having a thickness of 1000 angstroms, an Ni film having a thickness of 1000 angstroms and an Ag film having a thickness of 10000 angstroms. FIG. 4B is a cross sectional view showing a condition after finishing the fifth process. The TiNiAg film 23 is formed such that a portion of the TiNiAg film 23 overlaps the step surface 22c exposed at each edge portion of the opening of the cover insulating film 22. In this case, a portion of the TiNiAg film 23 deposited on the patterned photo resist film 25 and a portion of the TiNiAg film 23 deposited on the source electrode 20 and the step surface 22c do not connect with each other.

Figure 4C:
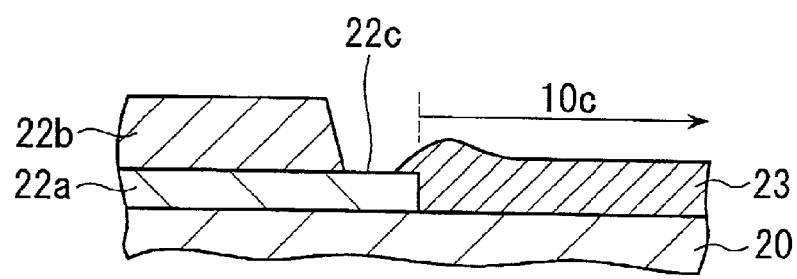

After finishing the fifth process, in the sixth process, a portion of the TiNiAg film 23 on the patterned photo resist film 25 are removed by using a lift-off method, and further the patterned photo resist film 25 is removed. FIG. 4C is a cross sectional view showing a condition after finishing the sixth process.

In the above-mentioned manufacturing method according to the present embodiment, the silicon nitride film 22a and the PSG film 22b are formed in order as the cover insulating film 22. By using the patterned photo resist film 25 as an etching mask, the PSG film 22b is isotropically etched and the silicon nitride film 22a is plasma-etched. Due to the side-etching caused by the isotropical etching, the opening 52b of the PSG film 22b becomes wider than the opening 52a of the silicon nitride film 22a. Therefore, there is produced a step portion at each edge of the opening of the cover insulating film 22. That is, the step surface 22c is formed by an upper surface portion of the silicon nitride film 22a which is exposed via the opening 52b of the PSG film 22b. The TiNiAg film 23 is formed such that a portion of the TiNiAg film 23 overlaps the step surface 22c. Also, a portion of the TiNiAg film 23 on the patterned photo resist film 25 can be removed by using a lift-off method. Therefore, it is possible to completely protect the source electrode 20 made of an aluminum film of the source pad portion 10c from the corrosive substance.

Next, with reference to partial enlarged cross sectional views of FIGS. 5A–5C and FIGS. 6A–6C, an explanation will be made on a method of manufacturing the MOSFET 100, according to a second method embodiment. Similarly to the first method embodiment, in the second method embodiment, an explanation of a process until the source electrode 20 and the aluminum gate finger 21 are formed is omitted here.

Figure 5A:
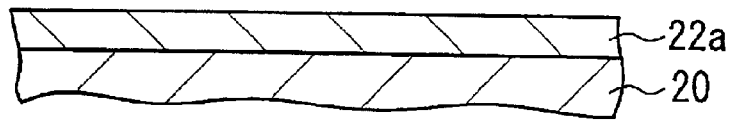
FIGS. 5A–5C are partial enlarged cross sectional views illustrating structures obtained during a process of manufacturing the MOSFET 100 of FIG. 1, according to a second method embodiment.

First, in the first process of the second embodiment, a silicon nitride film 22a is formed as the lower layer of a cover insulating film 22 on a source electrode 20 by using a plasma CVD method. The silicon nitride film 22a has a thickness, for example, of 5000 angstroms. FIG. 5A is a cross sectional view showing a condition after finishing the first process.

Figure 5B:
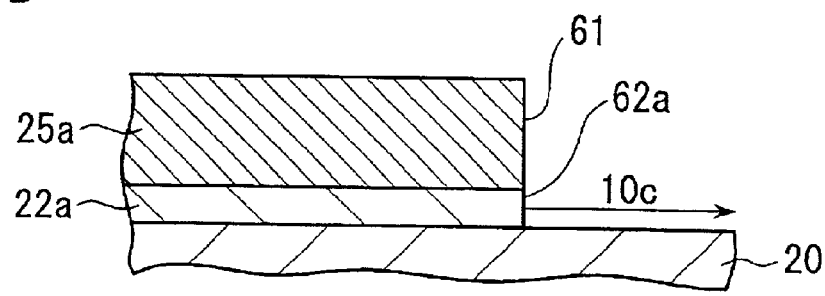

After finishing the first process, in the second process, a photo resist film having predetermined patterns, i.e., a patterned photo resist film 25a is formed on the silicon nitride film 22a by using a photolithography method. The patterned photo resist film 25a has an opening 61 which corresponds to a source pad portion 10c. Then, by using the patterned photo resist film 25a as an etching mask, a portion of the silicon nitride film 22a corresponding to the source pad portion 10c is removed by using a plasma etching method. Thereby, an opening 62a is formed in the silicon nitride film 22a. FIG. 5B is a cross sectional view showing a condition after finishing the second process.

Figure 5C:
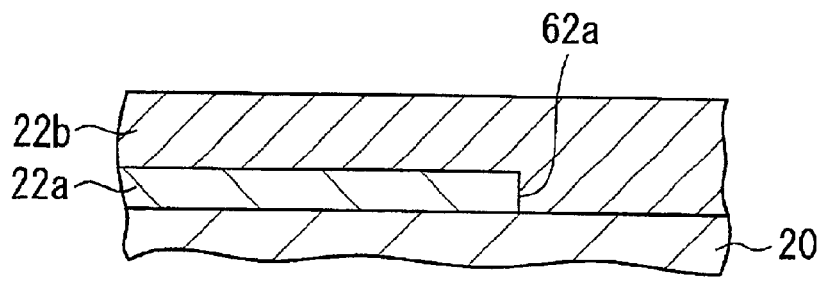

After finishing the second process, in the third process, the patterned photo resist film 25a is removed. Thereafter, a PSG film 22b is formed as the upper layer of the cover insulating film 22 on the silicon nitride film 22a having the opening 62a, by using an atmospheric pressure CVD method. The PSG film 22b has a thickness of, for example, 10000 angstroms. FIG. 5C is a cross sectional view showing a condition after finishing the third process.

Figure 6A:
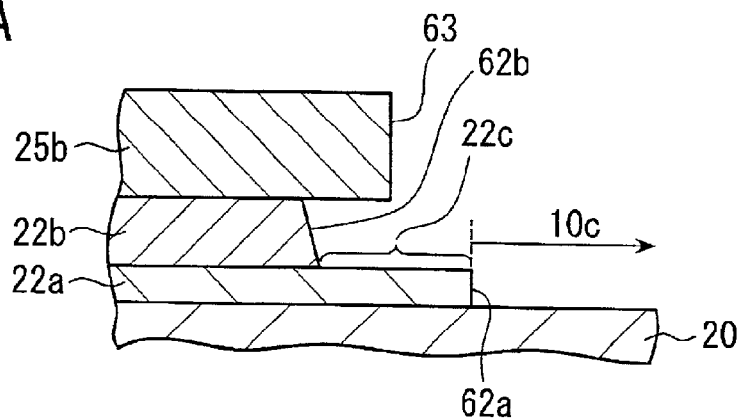
FIGS. 6A–6C are partial enlarged cross sectional views illustrating structures obtained after the structures shown in FIGS. 5A–5C during a process of manufacturing the MOSFET 100 of FIG. 1, according to the second method embodiment.

After finishing the third process, in the fourth process, a patterned photo resist film 25b is formed on the PSG film 22b by using a photolithography method. The patterned photo resist film 25b has an opening 63 at the source pad portion 10c which is wider than the opening 62a of the silicon nitride film 22a. Then, by using the patterned photo resist film 25b as an etching mask, a portion of the PSG film 22b corresponding to the source pad portion 10c is selectively removed by isotropic etching, for example, by using an wet etching method. Thereby, an opening 62b is formed in the PSG film 22b. In this process, the PSG film 22b is also side-etched from an edge of the patterned photo resist film 25b. Therefore, the opening 62b of the PSG film 22b becomes wider than the opening 63 of the patterned photo resist film 25b by the amount of the side-etching. Thus, the opening 62b of the PSG film 22b becomes wider than the opening 62a of the silicon nitride film 22a. Thereby, there is produced a step portion at each edge or side wall of the opening of the cover insulating film 22. That is, the step surface 22c is formed by an upper surface portion of the silicon nitride film 22a which is exposed via the opening 62b of the PSG film 22b. FIG. 6A is a cross sectional view showing a condition after finishing the fourth process.

Figure 6B:
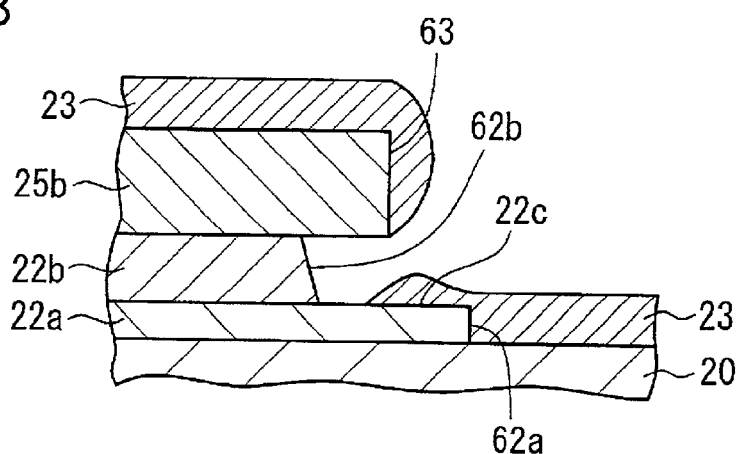

After finishing the fourth process, in the fifth process, while leaving the patterned photo resist film 25b, an TiNiAg film 23 is deposited by using a sputtering method or a vapor deposition method. The TiNiAg film 23 comprises, for example, a Ti film having a thickness of 1000 angstroms, an Ni film having a thickness of 1000 angstroms and an Ag film having a thickness of 10000 angstroms. The TiNiAg film 23 is formed such that a portion of the TiNiAg film 23 overlaps the step surface 22c exposed at the edge portion of the opening of the cover insulating film 22. In the manufacturing method according to the first embodiment, the width of the opening 52a of the silicon nitride film 22a and the width of the opening 51 of the patterned photo resist film 25 are the same as each other. However, in the manufacturing method according to this embodiment, the opening 63 of the patterned photo resist film 25b becomes wider than the opening 62a of the silicon nitride film 22a. Therefore, in this embodiment, the size of a portion of the TiNiAg film 23 which overlaps the step surface 22c becomes larger than that of the first embodiment. In this case, a portion of the TiNiAg film 23 deposited on the patterned photo resist film 25b and a portion of the TiNiAg film 23 deposited on the source electrode 20 and the step surface 22c do not connect with each other. FIG. 6B is a cross sectional view showing a condition after finishing the fifth process.

Figure 6C:
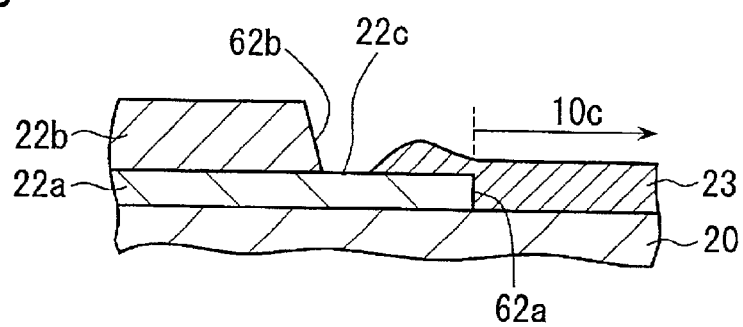

After finishing the fifth process, in the sixth process, a portion of the TiNiAg film 23 on the patterned photo resist film 25b are removed by using a lift-off method, and further the patterned photo resist film 25b is removed. FIG. 6C is a cross sectional view showing a condition after finishing the sixth process.

In the above-mentioned manufacturing method according to the second embodiment, first, the silicon nitride film 22a is formed as the lower layer of the cover insulating film 22. Then, by using the patterned photo resist film 25a as an etching mask, an opening 62a is formed in the silicon nitride film 22a by using a plasma etching method. Thereafter, the PSG film 22b is deposited. By using the patterned photo resist film 25b which has an opening 63 wider than the opening 62a of the silicon nitride film 22a as an etching mask, an opening 62b is formed in the PSG film 22b by using an isotropical etching method. Due to the side-etching caused by the isotropical etching, the opening 62b of the PSG film 22b becomes wider than the opening 63 of the patterned photo resist film 25b. Therefore, there is produced a step portion at each edge of the opening of the cover insulating film 22. That is, the step surface 22c is formed by an upper surface portion of the silicon nitride film 22a which is exposed via the opening 62b of the PSG film 22b. The TiNiAg film 23 is formed such that a portion of the TiNiAg film 23 overlaps the step surface 22c. Also, a portion of the TiNiAg film 23 on the patterned photo resist film 25b can be removed by using a lift-off method. In this embodiment, the size of a portion of the TiNiAg film 23 which overlaps the step surface 22c becomes larger than that of the first embodiment. Therefore, in this embodiment, it is possible to protect the source electrode 20 made of an aluminum film of the source pad portion 10c from the corrosive substance with a margin larger than that of the first method embodiment.

Figure 7:
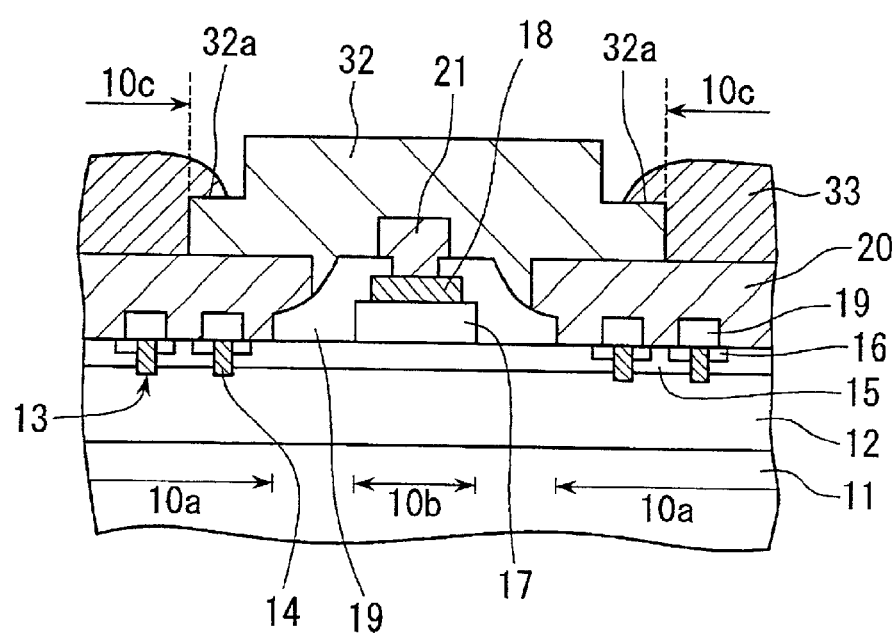
FIG. 7 is a schematic partially enlarged cross sectional view of a MOSFET 200 having an UMOS structure, according to a second device embodiment of the present invention.

With reference to a schematic partially enlarged cross sectional view of FIG. 7, an explanation will now be made on a MOSFET 200 having an UMOS structure, according to a second device embodiment of the present invention. In the MOSFET 200, portions from the N+ type silicon substrate 11 to the source electrode 20 and the aluminum gate finger 21 have the same structure as those of the above-mentioned MOSFET 100, and an explanation concerning these portions is omitted here. Here, an explanation will be made on a structure of portions on the source electrode 20 and the aluminum gate finger 21. In the MOSFET 200 of the present device embodiment, a cover insulating film 32 is formed on the source electrode 20 and the aluminum gate finger 21. The cover insulating film 32 is made of a PSG film. A TiNiAg film 33 is formed at the source pad portion 10c on the source electrode 20 via an opening of the cover insulating film 32. There is provided a step portion at each edge or side wall of the opening of the cover insulating film 32. The TiNiAg film 33 is formed such that the TiNiAg film 33 overlaps a step surface 32a of the step portion. The cross sectional view shown in FIG. 7 corresponds to a cross sectional view taken along a section line of the chip surface of the MOSFET 200 similar to the section line X—X of the chip surface of MOSFET 100 shown in FIG. 2.

In the above-mentioned structure, the step portion is formed at each edge portion of the opening of the cover insulating film 32 made of a PSG film. Also, the TiNiAg film 33 is formed such that the TiNiAg film 33 partially overlaps the step surface 32a of the step portion. Therefore, in the MOSFET 200 according to the present embodiment, it is possible to completely protect the source electrode 20 made of an aluminum film of the source pad portion 10c from the corrosive substance which can corrode the aluminum film.

Next, with reference to partial enlarged cross sectional views of FIGS. 8A–8C and FIGS. 9A–9C, an explanation will be made on a method of manufacturing the MOSFET 200, according to an embodiment of manufacturing method. A process until the source electrode 20 and the aluminum gate finger 21 are formed can be the same as a conventionally used process, and an explanation thereof is omitted here. Therefore, a process of forming the cover insulating film 32 and a process thereafter will be described here. FIGS. 8A–8C and FIGS. 9A–9C only show cross sections corresponding to a portion on the source electrode 20 and in the proximity of an edge of the opening of the cover insulating film 32.

Figure 8A:
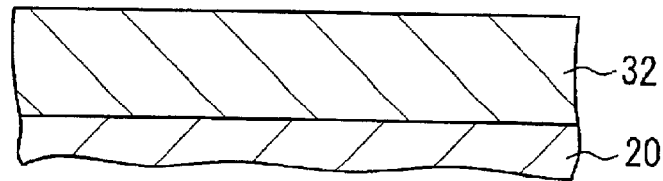
FIGS. 8A–8C are partial enlarged cross sectional views illustrating structures obtained during a process of manufacturing the MOSFET 200 of FIG. 7, according to a third method embodiment.

In the first process of this embodiment, a cover insulating film 32 is formed on a source electrode 20 by using a plasma CVD method. The cover insulating film 32 is made, for example, of a PSG film which has a thickness of 15000 angstroms. FIG. 8A is a cross sectional view showing a condition after finishing the first process.

Figure 8B:
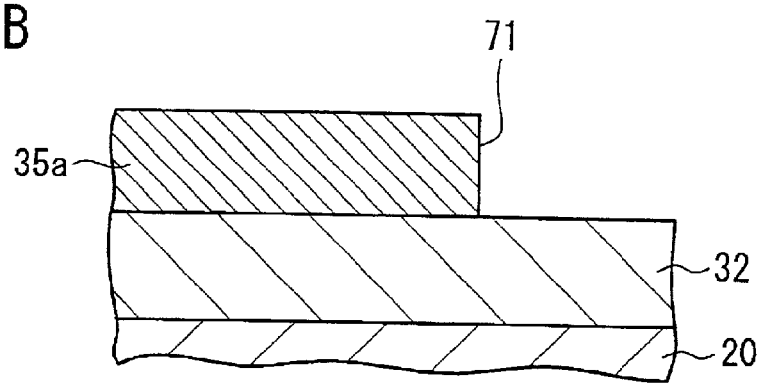

After finishing the first process, in the second process, a photo resist film having predetermined patterns, i.e., a patterned photo resist film 35a is formed on the cover insulating film 32 by using a photolithography method. The patterned photo resist film 35a has an opening 71 which corresponds to a source pad portion 10c. FIG. 8B is a cross sectional view showing a condition after finishing the second process.

Figure 8C:
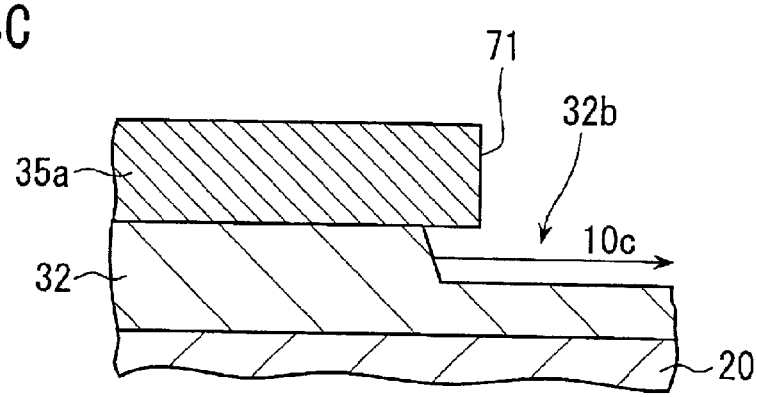

After finishing the second process, in the third process, by using the patterned photo resist film 35a as an etching mask, a portion of the cover insulating film 32 corresponding to the source pad portion 10c is selectively removed by using an isotropic etching method or an anisotropic etching method. An example of the isotropic etching is a wet etching, and an example of the anisotropic etching is an ion etching of a plasma etching. Here, for example, by using the isotropic etching, the cover insulating film 32 is selectively removed such that the thickness of the cover insulating film 32 becomes, for example, 7500 angstroms to form a trench 32b. In this case, a portion of the cover insulating film 32 just under the patterned photo resist film 35a is side-etched from the edge of the patterned photo resist film 35a. Therefore, the size of the trench 32b of the cover insulating film 32 becomes wider than the width of the opening 71 of the patterned photo resist film 35a by the amount of the side etch. FIG. 8C is a cross sectional view showing a condition after finishing the third process.

Figure 9A:
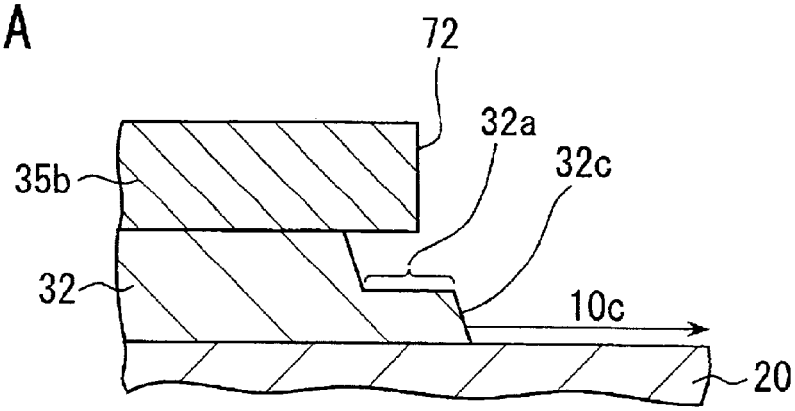
FIGS. 9A–9C are partial enlarged cross sectional views illustrating structures obtained after the structures shown in FIGS. 8A–8C during a process of manufacturing the MOSFET 200 of FIG. 7, according to the third method embodiment.

After finishing the third process, in the fourth process, the patterned photo resist film 35a is removed. Then, the cover insulating film 32 is newly masked by a patterned photo resist film 35b. The patterned photo resist film 35b has an opening 72 at the source pad portion 10c, and the opening 72 is wider than the size of the trench 32b of the cover insulating film 32. Then, a portion of the cover insulating film 32 exposed via the opening 72 of the patterned photo resist film 35b is selectively removed by an isotropic etching method, for example, a wet etching method. This isotropic etching is performed until a portion of the source electrode 20 is exposed at the bottom portion of the trench 32b of the cover insulating film 32. Thereby, an opening 32c is formed in the cover insulating film 32. In this case, a portion of the cover insulating film 32 just under the patterned photo resist film 35b is side-etched from the edge portion of the patterned photo resist film 35b. Therefore, a step portion is produced at each edge or side wall of the opening of the cover insulating film 32. Thereby, a step surface 32a of the cover insulating film 32 is formed. FIG. 9A is a cross sectional view showing a condition after finishing the fourth process.

Figure 9B:
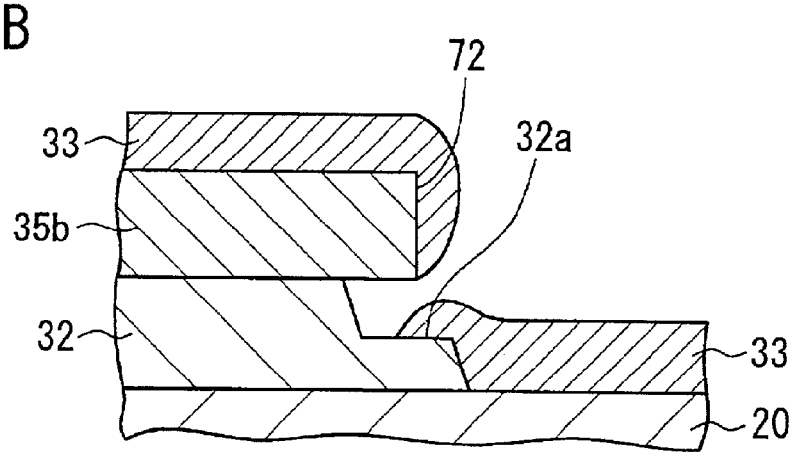

After finishing the fourth process, in the fifth process, while leaving the patterned photo resist film 35b, an TiNiAg film 33 is deposited by using a sputtering method or a vapor deposition method. The TiNiAg film 33 comprises, for example, a Ti film having a thickness of 1000 angstroms, an Ni film having a thickness of 1000 angstroms and an Ag film having a thickness of 10000 angstroms. The TiNiAg film 33 is formed such that a portion of the TiNiAg film 33 overlaps the step surface 32a exposed at each edge portion of the opening of the cover insulating film 32. In the manufacturing method according to the first method embodiment concerning the above-mentioned MOSFET 100, the width of the opening 52a of the silicon nitride film 22a and the width of the opening 51 of the patterned photo resist film 25 are the same as each other. However, in the manufacturing method according to this embodiment, the opening 72 of the patterned photo resist film 35b becomes wider than the opening 32c of the cover insulating film 32. Therefore, the quantity of overlapping of the TiNiAg film 33 with the step surface 32a at the edge portion of the cover insulating film 32 becomes larger than that of the first method embodiment concerning the MOSFET 100. Also, in this embodiment, a portion of the TiNiAg film 33 deposited on the patterned photo resist film 35b and a portion of the TiNiAg film 33 deposited on the source electrode 20 and the step surface 32a do not connect with each other. FIG. 9B is a cross sectional view showing a condition after finishing the fifth process.

Figure 9C:
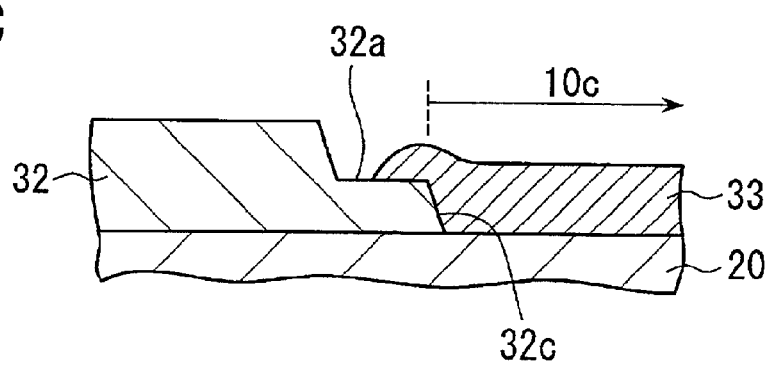

After finishing the fifth process, in the sixth process, a portion of the TiNiAg film 33 on the patterned photo resist film 35b are removed by using a lift-off method, and further the patterned photo resist film 35b is removed. FIG. 9C is a cross sectional view showing a condition after finishing the sixth process.

In the above-mentioned manufacturing method, first, the cover insulating film 32 made of a PSG film is formed. Then, by using the patterned photo resist film 35a as an etching mask, a trench 32b is formed in the cover insulating film 32 by using an isotropic etching method or an anisotropic etching method. After removing the patterned photo resist film 35a, a patterned photo resist film 35b is newly formed which has an opening wider than the opening of the trench 32b of the cover insulating film 32. By using the patterned photo resist film 35b as an etching mask, the cover insulating film 32 is selectively removed by isotropic etching, and a portion of the source electrode 20 is exposed via the trench 32b of the cover insulating film 32. Thereby, an opening 32c is formed in the cover insulating film 32. In this case, the cover insulating film 32 just under the patterned photo resist film 35b is side-etched. Therefore, there is produced a step portion at each edge of the opening of the cover insulating film 32, and thereby the step surface 32a is formed. The TiNiAg film 33 is formed such that a portion of the TiNiAg film 33 overlaps the step surface 32a. Also, a portion of the TiNiAg film 33 on the patterned photo resist film 35b can be removed by using a lift-off method. In this embodiment, the size of a portion of the TiNiAg film 33 which overlaps the step surface 32a becomes larger than that of the first method embodiment concerning the MOSFET 100. Therefore, it is possible to protect the source electrode 20 made of an aluminum film of the source pad portion 10c from the corrosive substance with a margin larger than that of the first method embodiment concerning the MOSFET 100.

Figure 10:
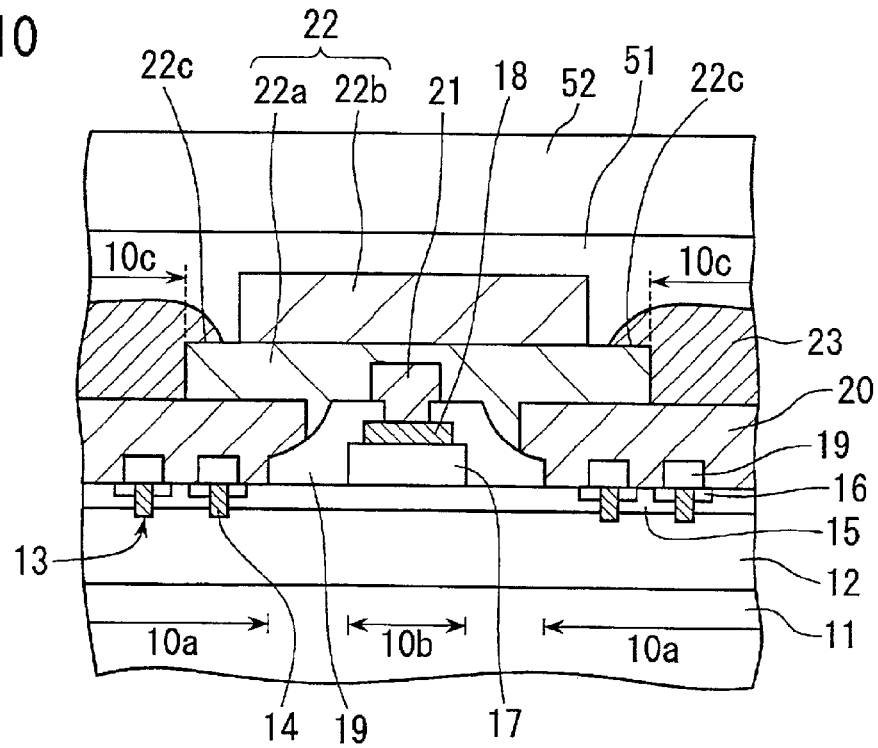
FIG. 10 is a cross sectional view showing an electrode extracting structure used when the MOSFET according to the present invention is packaged.
Figure 11:
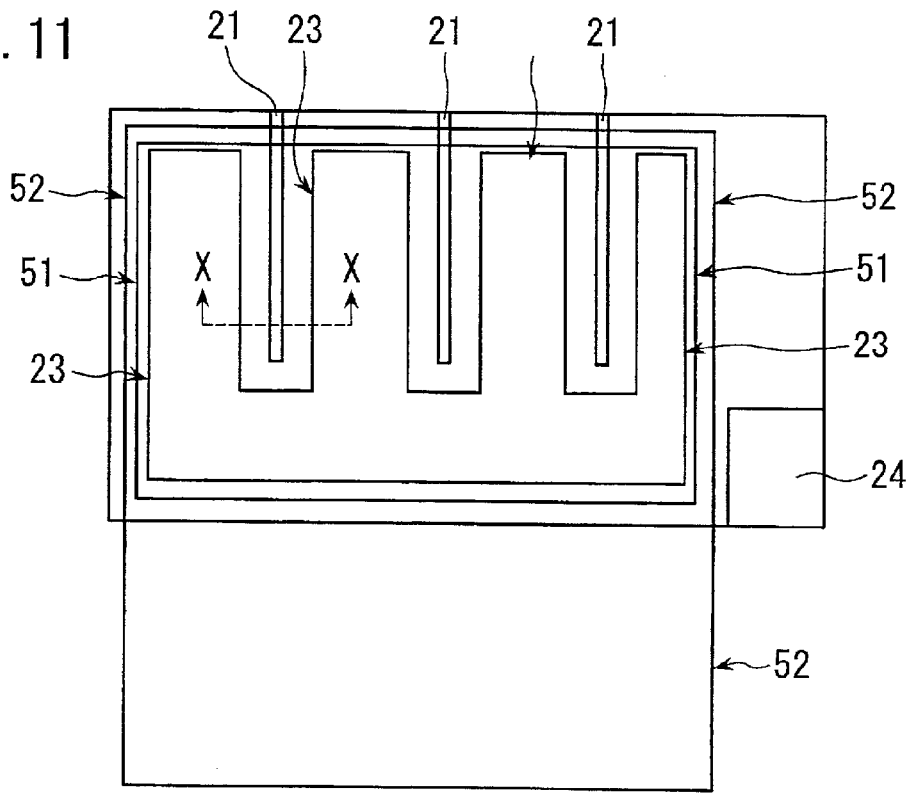
FIG. 11 is a plan view of the electrode extracting structure of FIG. 10.
Figure 12:
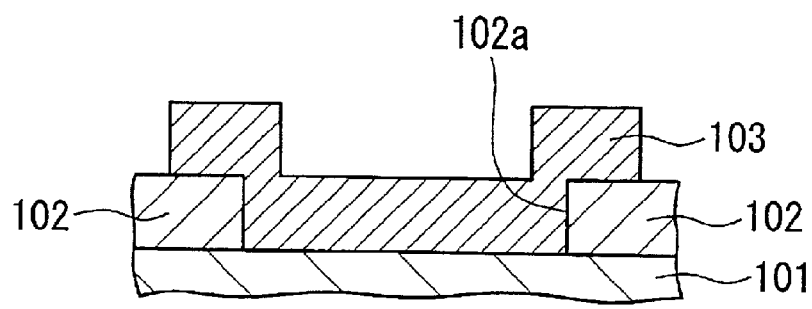
FIG. 12 is a partial enlarged cross sectional view of a conventional bonding pad electrode structure used in a semiconductor device.
Figure 13A:
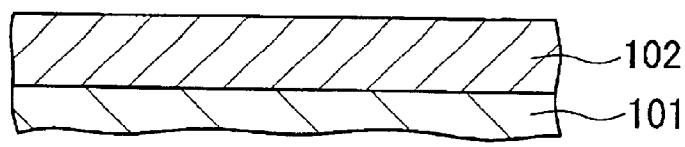
FIGS. 13A and 13B are partial enlarged cross sectional views illustrating structures obtained during a process of manufacturing the conventional bonding pad electrode structure shown in FIG. 12.
Figure 13B:
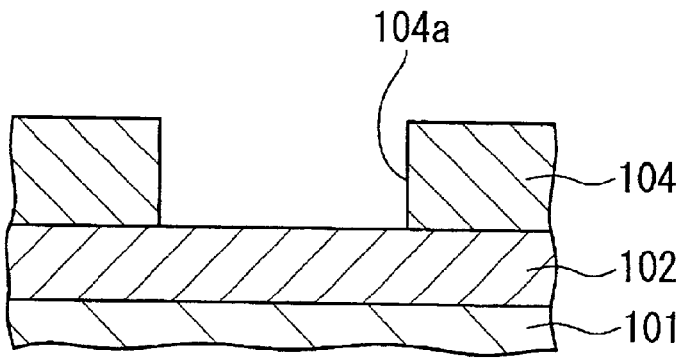
Figure 14A:
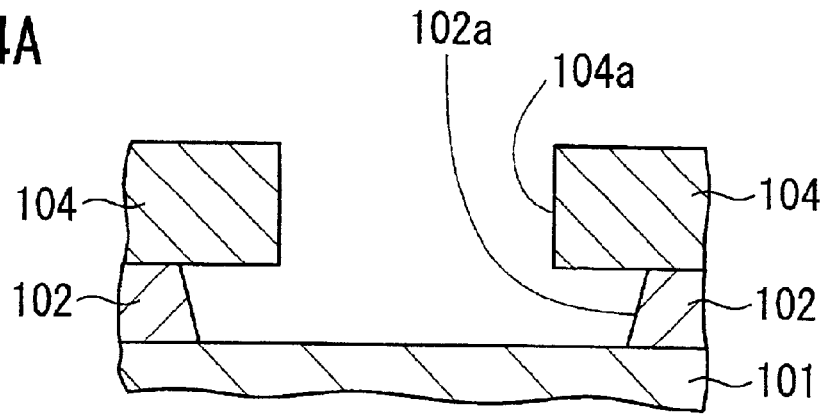
FIGS. 14A–14C are partial enlarged cross sectional views illustrating structures obtained after the structures shown in FIGS. 13A and 13B during a process of manufacturing the conventional bonding pad electrode structure shown in FIG. 12.
Figure 14B:
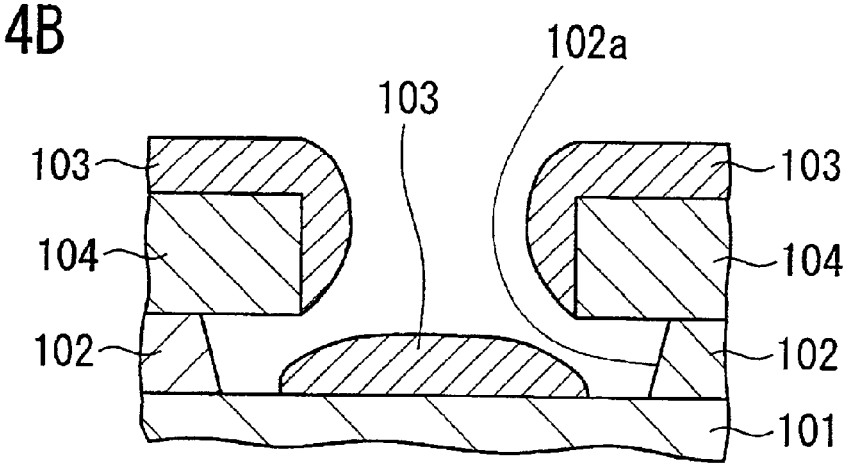
Figure 14C:
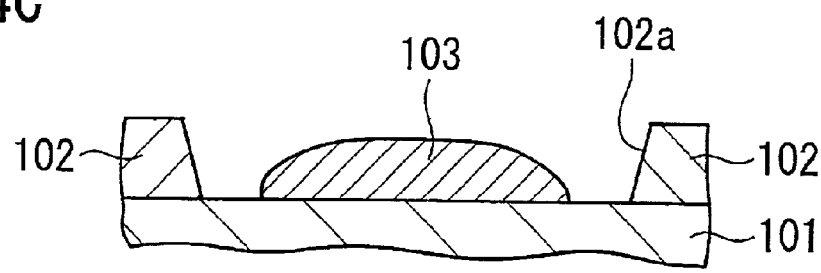

An explanation will now be made on an electrode extracting structure used when the above-mentioned MOSFET 100 or MOSFET 200 is packaged. Here, as an example, such electrode extracting structure for the MOSFET 100 is explained with reference to a cross sectional view of FIG. 10 and a plan view of FIG. 11. Description of the structure and manufacturing method of the MOSFET 100 was already provided in the above and is not repeated here. As shown in FIGS. 10 and 11, the TiNiAg film 23 of the MOSFET 100 is coupled with a high conductivity metal plate 52 via a conductive paste 51, for electrical coupling to an external terminal. The conductive paste 51 is, for example, Ag paste. The metal plate 52 is, for example, a copper plate. By providing the MOSFET 100 with the above-mentioned electrode extracting structure, the following advantageous effects can be obtained. That is, it is possible to protect the source electrode 20 from corrosive substance such as chlorine and the like contained in the Ag paste. Also, it is possible to reduce an electrical resistance from the source electrode 20 to the external terminal. Therefore, it is possible to reduce on-resistance of the packaged MOSFET 100.

In the above, description was made on MOSFET's having a UMOS structure. However, the present invention is not limited to such device. The present invention can be applied to a MOSFET having a gate planar structure, and can be applied to devices or elements other than MOSFET. Also, with respect to the electrode extracting structure mentioned above, it is preferable to use such structure in a power device or element, because it is possible to reduce an internal resistance or an operation resistance thereof by using such structure.

According to the semiconductor device and the method of manufacturing such semiconductor device of the present invention, it is possible to protect a lower metal layer constituting a bonding pad electrode from the substance which may corrode the lower metal layer. In the present invention, a cover insulating film is formed on the lower metal layer. An opening is formed in the cover insulating film to expose the lower metal layer. On a part of the lower metal layer, an upper electrode layer is deposited which has corrosion resistance against the substance that may corrode the lower metal layer. In this case, the upper portion of the opening of the cover insulating film is made wider than the lower portion thereof such that a step portion is provided at the edge portion of the opening of the cover insulating film. Also, the upper metal layer is formed on the step surface of the step portion such that the upper metal layer overlaps the step surface. Therefore, it is possible to manufacture a bonding pad electrode in which the lower metal layer is not exposed between the cover insulating film and the upper metal layer, technically easily and with good workability. Also, it is possible to manufacture a semiconductor device in which the lower metal layer can be completely protected from the corrosive substance, at low cost.

Also, in the semiconductor device according to the present invention, it becomes possible to couple a high conductivity metal plate to the upper metal layer via conductive paste. Thereby, it is possible to reduce an electrical resistance from the bonding pad electrode to an external terminal, while protecting the lower metal layer from a corrosive substance contained in the conductive paste. Also, it is possible to reduce an operation resistance of the packaged semiconductor device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method of manufacturing a semiconductor device having a bonding pad electrode of a multi-layer structure, said method comprising:

preparing a semiconductor substrate;

forming a lower electrode layer on said semiconductor substrate;

forming a cover insulating film on said lower electrode layer;

forming an opening in said cover insulating film to expose at least a portion of said lower electrode layer, wherein a step portion is provided at a side wall of said opening of said cover insulating film, the size of said opening at the upside portion of a step surface of said step portion is larger than the size of said opening at the downside portion of said step surface; and forming an upper electrode layer on said portion of said lower electrode layer exposed via said opening, wherein said upper electrode layer being made of material having corrosion resistance against substance which is corrosive to said lower electrode layer, and said upper electrode layer overlaps said step surface of said step portion, wherein said forming an opening in said cover insulating film to expose at least a portion of said lower electrode layer comprises:

forming a photo resist film having a first opening on said cover insulating film; and isotropically etching said cover insulating film by using said photo resist film as an etching mask, wherein said cover insulating film is side-etched with respect to said first opening of said photo resist film;

wherein said forming an upper electrode layer on said portion of said lower electrode layer exposed via said opening is performed by using a lift-off method in which said photo resist film is used as a mask.

2. A method of manufacturing a semiconductor device as set forth in claim 1, wherein said lower electrode layer comprises a metal film containing aluminum, and said upper electrode layer comprises a metal film which has corrosion resistance against substance corrosive to aluminum.

3. A method of manufacturing a semiconductor device as set forth in claim 2, wherein said upper electrode layer comprises a TiNiAg film.

4. A method of manufacturing a semiconductor device as set forth in claim 1, further comprising: coupling a high conductivity metal plate onto said upper electrode layer via a conductive paste, after forming said upper electrode layer on a portion of said lower electrode layer exposed via said opening.

5. A method of manufacturing a semiconductor device as set forth in claim 4, wherein said conductive paste is an Ag paste, and said metal plate is a copper plate.

6. A method of manufacturing a semiconductor device as set forth in claim 4, wherein said bonding pad electrode is a source pad electrode of a power MOSFET.

7. A method of manufacturing a semiconductor device as set forth in claim 1, wherein said bonding pad electrode is a source pad electrode of a MOSFET.

8. A method of manufacturing a semiconductor device having a bonding pad electrode of a multi-layer structure, said method comprising:

preparing a semiconductor substrate;

forming a lower electrode layer on said semiconductor substrate;

forming a cover insulating film on said lower electrode layer;

forming an opening in said cover insulating film to expose at least a portion of said lower electrode layer, wherein a step portion is provided at a side wall of said opening of said cover insulating film, the size of said opening at the upside portion of a step surface of said step portion is larger than the size of said opening at the downside portion of said step surface; and forming an upper electrode layer on said portion of said lower electrode layer exposed via said opening, wherein said upper electrode layer being made of material having corrosion resistance against substance which is corrosive to said lower electrode layer, and said upper electrode layer overlaps said step surface of said step portion, wherein said cover insulating film comprises a silicon nitride film and a PSG film;

wherein said forming said cover insulating film on said lower electrode layer comprises;

forming said silicon nitride film on said lower electrode layer; and forming said PSG film on said silicon nitride film;

wherein said forming an opening in said cover insulating film to expose at least a portion of said lower electrode layer comprises:

forming a photo resist film having a first opening on said PSG film;

isotropically etching said PSG film by using said photo resist film as an etching mask to form a second opening in said PSG film, wherein at least a portion of said silicon nitride film is exposed at the bottom portion of said second opening, and said PSG film is side-etched with respect to said first opening of said photo resist film; and plasma etching said silicon nitride film by using said photo resist film as an etching mask to form a third opening in said silicon nitride film, wherein at least a portion of said lower electrode layer is exposed at the bottom portion of said third opening, said third opening is smaller than said second opening, and said step surface of said step portion is formed by the upper surface portion of said silicon nitride film exposed via said second opening of said PSG film; and wherein said forming an upper electrode layer on said portion of said lower electrode layer exposed via said opening of said cover insulating film comprises:

depositing a material to be said upper electrode layer on said exposed portion of said lower electrode layer, at least a portion of said step surface and said photo resist film; and removing a portion of said material deposited on said photo resist film by using a lift-off method, wherein portions of said material deposited on said exposed portion of said lower electrode layer and on said step portion are not removed, thereby said upper electrode layer is formed.

9. A method of manufacturing a semiconductor device having a bonding pad electrode of a multi-layer structure, said method comprising:

preparing a semiconductor substrate;

forming a lower electrode layer on said semiconductor substrate;

forming a cover insulating film on said lower electrode layer;

forming an opening in said cover insulating film to expose at least a portion of said lower electrode layer, wherein a step portion is provided at a side wall of said opening of said cover insulating film, the size of said opening at the upside portion of a step surface of said step portion is larger than the size of said opening at the downside portion of said step surface; and forming an upper electrode layer on said portion of said lower electrode layer exposed via said opening, wherein said upper electrode layer being made of material having corrosion resistance against substance which is corrosive to said lower electrode layer, and said upper electrode layer overlaps said step surface of said step portion, wherein said cover insulating film comprises a silicon nitride film and a PSG film;

wherein said forming said cover insulating film on said lower electrode layer comprises;

forming said silicon nitride film on said lower electrode layer;

forming a first photo resist film having a first opening on said silicon nitride film; plasma etching said silicon nitride film by using said first photo resist film as an etching mask to form a second opening in said silicon nitride film;

removing said first photo resist film; and forming said PSG film on said silicon nitride film so as to fill said second opening of said silicon nitride film;

wherein said forming an opening in said cover insulating film to expose at least a portion of said lower electrode layer comprises:

forming a second photo resist film having a third opening on said PSG film, wherein said third opening is larger than said second opening; and isotropically etching said PSG film by using said second photo resist film as an etching mask to form a fourth opening in said PSG film, wherein said PSG film is side-etched with respect to said third opening of said second photo resist film, said fourth opening is larger than said second opening, at least a portion of said lower electrode layer is exposed via said second and fourth openings, and the upper surface portion of said silicon nitride film exposed via said fourth opening of said PSG film forms said step surface of said step portion;

wherein said forming an upper electrode layer on said portion of said lower electrode layer exposed via said opening of said cover insulating film comprises:

depositing a material to be said upper electrode layer on said exposed portion of said lower electrode layer, at least a portion of said step surface and said photo resist film; and removing a portion of said material deposited on said second photo resist film by using a lift-off method, wherein portions of said material deposited on said exposed portion of said lower electrode layer and on said step surface are not removed, thereby said upper electrode layer is formed.

10. A method of manufacturing a semiconductor device having a bonding pad electrode of a multi-layer structure, said method comprising:

preparing a semiconductor substrate;

forming a lower electrode layer on said semiconductor substrate;

forming a cover insulating film on said lower electrode layer;

forming an opening in said cover insulating film to expose at least a portion of said lower electrode layer, wherein a step portion is provided at a side wall of said opening of said cover insulating film, the size of said opening at the upside portion of a step surface of said step portion is larger than the size of said opening at the downside portion of said step surface; and forming an upper electrode layer on said portion of said lower electrode layer exposed via said opening, wherein said upper electrode layer being made of material having corrosion resistance against substance which is corrosive to said lower electrode layer, and said upper electrode layer overlaps said step surface of said step portion, wherein, in said forming said cover insulating film on said lower electrode layer, a PSG (phospho silicate glass) film is formed as said cover insulating film on said lower electrode layer;

wherein said forming an opening in said cover insulating film to expose at least a portion of said lower electrode layer comprises:

forming a first photo resist film having a first opening on said PSG film;

etching said PSG film by using said first photo resist film as an etching mask to form a trench in said PSG film, wherein, in the bottom portion of said trench, said lower electrode layer is not exposed;

removing said first photo resist film;

forming a second photo resist film having a second opening on said PSG film, wherein said second opening is larger than the size of said trench; and isotropically etching said PSG film by using said second photo resist film as an etching mask to expose at least a portion of said lower electrode layer at the bottom portion of said trench, wherein said PSG film is side-etched with respect to said second opening of said second photo resist film, and said step surface of said step portion is formed at the side surface of said exposed PSG film;

wherein said forming an upper electrode layer on said portion of said lower electrode layer exposed via said opening of said cover insulating film comprises:

depositing a material to be said upper electrode layer on said exposed portion of said lower electrode layer, at least a portion of said step surface and said second photo resist film; and removing a portion of said material deposited on said second photo resist film by using a lift-off method, wherein portions of said material deposited on said exposed portion of said lower electrode layer and on said step surface are not removed, thereby said upper electrode layer is formed.

* * * * *